(12) United States Patent
Lu et al.

(10) Patent No.: US 7,091,754 B2
(45) Date of Patent: Aug. 15, 2006

(54) CMOS LVPECL DRIVER WITH OUTPUT LEVEL CONTROL

(75) Inventors: Timothy Lu, Campbell, CA (US); Vincent S. Tso, Milpitas, CA (US)

(73) Assignee: Exar Corporation, Fremont, CA (US)

(*) Notice: Subject to any disclaimer, the term of this patent is extended or adjusted under 35 U.S.C. 154(b) by 42 days.

(21) Appl. No.: 10/879,475

(22) Filed: Jun. 28, 2004

(65) Prior Publication Data
US 2005/0285637 A1 Dec. 29, 2005

(51) Int. Cl.
*H03K 3/00* (2006.01)
(52) U.S. Cl. .................... 327/108; 327/112
(58) Field of Classification Search ........ 327/108–112; 326/82, 83
See application file for complete search history.

(56) References Cited

U.S. PATENT DOCUMENTS

| | | | | |
|---|---|---|---|---|
| 5,384,498 A | * | 1/1995 | Wong | 326/31 |
| 5,614,843 A | * | 3/1997 | Mita et al. | 326/73 |
| 5,990,711 A | * | 11/1999 | Sekimoto | 327/112 |
| 6,054,874 A | * | 4/2000 | Sculley et al. | 326/83 |
| 6,111,431 A | * | 8/2000 | Estrada | 326/83 |
| 6,175,250 B1 | * | 1/2001 | Hedberg | 326/83 |
| 6,600,346 B1 | * | 7/2003 | Macaluso | 327/108 |
| 6,624,670 B1 | * | 9/2003 | Payne et al. | 327/108 |
| 6,803,798 B1 | * | 10/2004 | Wei et al. | 327/178 |
| 6,927,608 B1 | * | 8/2005 | Chen et al. | 327/108 |

* cited by examiner

*Primary Examiner*—Kenneth B. Wells
(74) *Attorney, Agent, or Firm*—Townsend and Townsend and Crew LLP

(57) ABSTRACT

A differential output driver includes an output block, a replication block, and a feedback control block. Each of the output and replication blocks further includes a preamplifier and a source-follower stage. The preamplifier of the output block receives a differential input voltage and generates a first differential voltage. The source-follower stage of the output block receives the first differential voltage and generates a differential output voltage. The preamplifier of the replication block receives first and second supply voltages and generates a second differential voltage. The source-follower stage of the output block receives the second differential voltage and generates a third differential voltage. The feedback control block receives the third differential voltage and generates a differential control voltage applied to the output block. The generated differential output voltage stays within predefined limits, such as those defined by the LvPECL standard.

11 Claims, 2 Drawing Sheets

CMOS LVPECL DRIVER WITH OUTPUT LEVEL CONTROL

FIELD OF THE INVENTION

The present invention relates to integrated circuits, and more particularly to CMOS output drivers

BACKGROUND OF THE INVENTION

Output drivers are typically used, in part, to ensure that the generated output voltages stay within predefined limits. FIG. 1 is a transistor schematic diagram of a differential CMOS output driver 10, as known in the prior art. If input voltage Vin applied to the gate terminal of transistor 16 is greater than voltage Vip applied to the gate terminal of transistor 18, transistor 16 is on and transistor 18 is off. Therefore, node A is pulled to a relatively lower voltage, and node B is pulled to a relatively higher voltage. Therefore voltage signal Vop generated at the source terminal of transistor 20 is pulled to a relatively lower voltage, and voltage signal Von generated at the source terminal of transistor 22 is pulled to a relatively higher voltage. Similarly, if input voltage Vin is lower than voltage Vip, transistor 16 is off and transistor 18 is on. Therefore, node B is pulled to a relatively lower voltage, and node A is pulled to a relatively higher voltage. Therefore voltage signal Von is pulled to a relatively lower voltage, and voltage signal Vop is pulled to a relatively higher voltage.

Differential output driver 10 is adapted so as to maintain signals Von and Vop within the predefined voltage ranges $V_{OH}$ and $V_{OL}$, as shown in FIG. 2. In other words, following a high-to-low transition by signal Von and a corresponding low-to-high transition by signal Vop, signal Von is maintained within the predefined limits of $V_{OL}$, and signal Vop is maintained within the predefined limits of $V_{OH}$. Similarly, following a high-to-low by signal Vop and a corresponding low-to-high transition by signal Von, signal Vop is maintained within the predefined limits of $V_{OH}$, and signal Vop is maintained within the predefined limits of $V_{OL}$, as shown in FIG. 2.

One known standard for differential output driver is referred to as the low voltage positive emitter coupled logic (LvPECL) standard, defined in JEDEC standard JESD8-2. This standard requires that VOH and VOL be within the following limits of supply voltage VDD:

|     | Min          | Max          |
| --- | ------------ | ------------ |
| VOH | VDD - 1.02 v | VDD - 0.88 v |
| VOL | VDD - 1.81 v | VDD - 1.62 v |

The temperature and process induced variations in the gate-to-source and threshold voltages of the MOS transistors used in conventional CMOS output driver 10 render this output driver unable to meet the requirements defined by the LvPECL standard. Accordingly, a need continues to exist for a CMOS output driver adapted to meet the requirements defined by the LvPECL standard.

BRIEF SUMMARY OF THE INVENTION

In accordance with the present invention, a differential output driver is adapted to generate a differential output voltage that stays within predefined limits, such as the limits defined by the LvPECL standard. The differential output driver includes, in part, an output block, a replication block, and a feedback control block that, in turn, includes a pair of control loops. Each of the output block and the replication block includes, in part, a differential preamplifier and a source-follower amplification stage (hereinafter alternatively referred to as source-follower stage). The differential preamplifier of the output block is adapted to receive a differential input voltage signal and generate a first differential voltage signal. The source-follower stage of the output block adapted is adapted to receive the first differential voltage signal and generate a differential output voltage. The differential preamplifier of the replication block is adapted to receive first and second supply voltages and generate a second differential voltage signal. The source-follower stage of the output block is adapted to receive the second differential voltage signal and generate a third differential voltage signal. The feedback control block is adapted to receive the third differential voltage signal and generate differential control voltages applied to the output block The preamplifier in each of the output and replication blocks generates a differential voltage that is delivered as input signals to the respective source-follower stage. Each source-follower stage includes a cross-coupled pull-down transistor pair with current gain of approximately one.

Each preamplifier includes active load transistors biased in the linear region. A different resistor is connected in parallel with each such active load transistor to further linearize that active load resistor. Each preamplifier further includes a transistor adapted to maintain the source voltage of an associated transistor in the corresponding source-follower stage within the levels defined by, for example, the LvPECL standard. Each transistor and/or resistor disposed in the replication block has a channel-width to channel-length ratio that is N times smaller than the channel-width to channel-length ratio of a corresponding transistor in the output block.

DETAILED DESCRIPTION OF THE INVENTION

Figure 1:
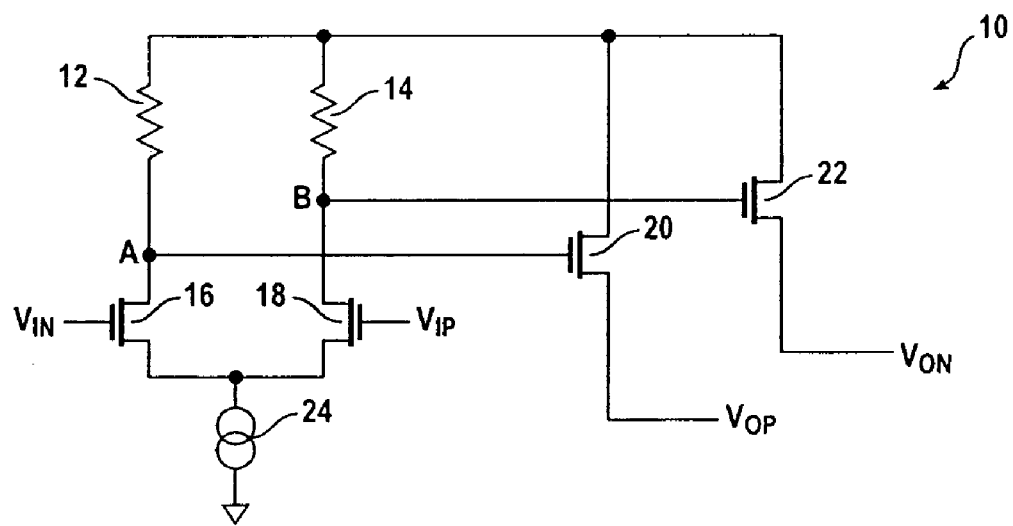
FIG. 1 is a transistor schematic diagram of a differential CMOS output driver, as known in the prior art.
Figure 2:
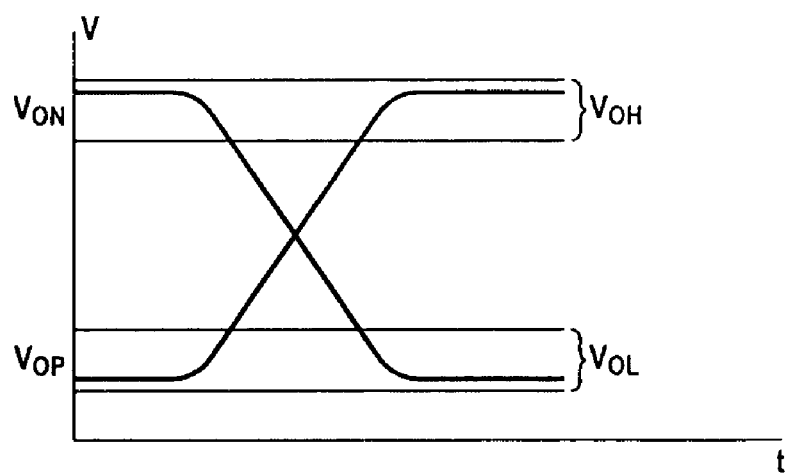
FIG. 2 shows output voltage transitions of the differential CMOS output driver of FIG. 1 as well as the ranges of voltage $V_{OL}$, and $V_{OH}$.

In accordance with the present invention, a differential CMOS output driver is adapted to generate a differential output voltage that stays within predefined limits, such as the limits defined by the LvPECL standard. FIG. 1 is a transistor schematic diagram of a differential CMOS output driver 400, in accordance with one embodiment of the present invention. Differential CMOS output driver (hereinafter alternatively referred to as output driver) 400 includes an output block 100, a replication block 200, and a feedback control block 300.

Output block 100 further includes preamplifier 50 and source-follower stage 80. Preamplifier 50 receives differential input voltages Vin and Vip, and in response, generates differential output voltages On_pre, and Op_pre, which are delivered as input signals to source-follower stage 80.

Source-follower stage 80 is a differential source-follower amplifier with a cross-coupled pull-down current gain of approximately one.

Preamplifier 50 receives, in part, differential input voltages Vin and Vip, which are respectively applied to the gate terminals of transistors MN1 and MN2. If voltage Vin is greater than voltage Vip, transistor MN1 is on and transistor MN2 is off. This causes current supplied to current source Isource1 to flow thru transistor MN1, which in turn, causes the voltage at the drain terminal of transistor MN1 (which is coupled to the gate terminal of transistor MS2) to be pulled to a relatively lower voltage, while the voltage at the gate terminal of transistor MS2 is pulled to a relatively higher voltage. This, in turn, causes voltage Vop to increase and voltage Von to decrease.

If voltage Vip is greater than voltage Vin, transistor MN1 is off and transistor MN2 is on. This causes current supplied to current source Isource1 to flow thru transistor MN2, which in turn, causes the voltage at the gate terminal of transistor MS2 to be pulled to a relatively lower voltage, while the voltage at the gate terminal of transistor MS1 is pulled to a relatively higher voltage. This, in turn, causes voltage Von to increase and voltage Vop to decrease.

Transistors MP1, and MP2 of preamplifier 50 are active load transistors and are biased in the linear region. Transistor MP1 is the active load for transistor MN1, and transistor MP2 is the active load for transistor MN2. Resistor R1 of preamplifier 50 is connected in parallel with and linearizes active load transistor MP1. Similarly, resistor R2 of preamplifier 50 is connected in parallel with and linearizes active load transistor MP2. Transistor MP3 of preamplifier 50 clamps the gate voltage of transistor MS2 of source-follower stage 80 such that the source voltage of transistor MS2 (i.e., voltage Vop) does not exceed the voltage level defined by the LvPBCL standard. Similarly, transistor MP4 of preamplifier 50 clamps the gate voltage of transistor MS1 of source-follower stage 80 such that the source voltage of transistor MS1 (i.e., voltage Von) does not exceed the voltage level defined by the LvPECL standard.

Cross-coupled transistors MNC1, and MNC2 are adapted to aid the pull-down current. For example, when the voltage at the source terminal of transistor MS2 increases, transistor MNC1 conducts more current. This causes the source voltage of transistor MS1 to be pulled to a lower voltage, thus causing transistor MNC2 to become less conductive, and thereby raising voltage Vop. Similarly, when the voltage at the source terminal of transistor MS2 decreases, transistor MNC1 conducts less current. This causes the source voltage of transistor MS1 to be pulled to a higher voltage, thus causing transistor MNC2 to become more conductive, and thereby lowering voltage Vop.

To ensure that voltages Vop and Von stay within the LvPECL standard as process and temperature variations occur, control voltage Vol_fix is applied to the gate terminals of transistors MP1, MP2, and control voltage Voh_fix is applied to the gate terminals of transistors MP3, MP4, as described further below. Control voltages Vol_fix, Voh_fix are generated by feedback control block 300, which receives its input voltages from replication block 200.

Figure 3:
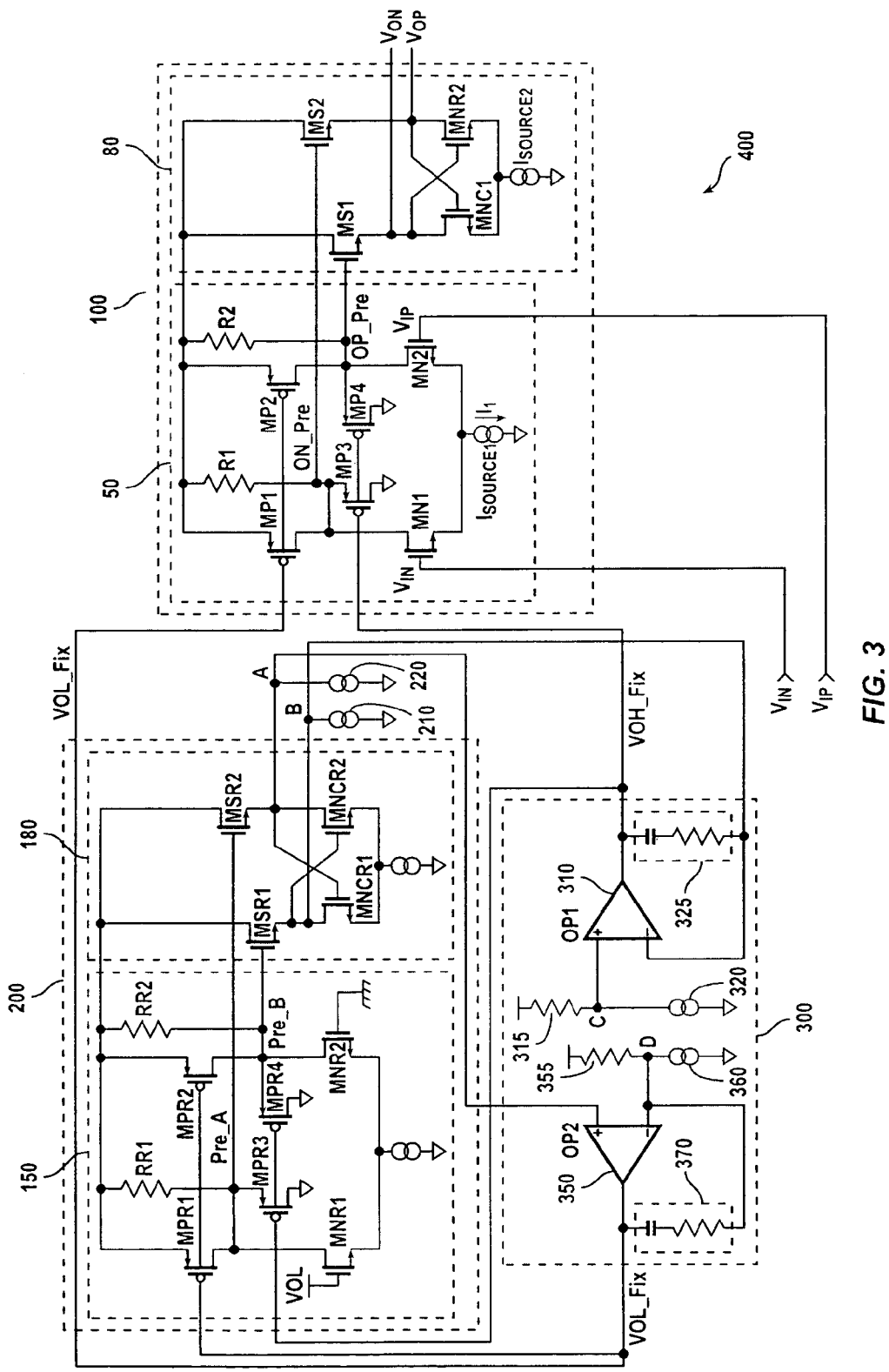
FIG. 3 is a transistor schematic diagram of a differential CMOS output driver, in accordance with one embodiment of the present invention.

Replication block 200 includes a preamplifier 150 and a source-follower stage 180. As seen from FIG. 3, replication block 200 is a scaled-down replica of output block 100. Accordingly, each transistor in replication block 200 has a channel-width to channel-length ratio that is 1/N times the channel-width to channel-length ratio of its corresponding transistor in output block 100. For example, the ratio of the channel-width to channel-length of transistor MPR1 is 1/N times the ratio of the channel-width to channel-length of transistor MP1. Similarly, for example, the ratio of the channel-width to channel-length of transistor MSR2 is 1/N times the ratio of the channel-width to channel-length of transistor MS2. In some embodiments, N may be a different number.

Preamplifier 150 receives supply voltage voltages Vcc and Vss at the respective gate terminals of transistors MNR1, and MNR2, and generates voltages Pre_A, and Pre_B at the respective source terminals of transistors MNR1, and MNR2. Signals Pre_A, and Pre_B are applied to the gate terminals of transistors MSR2, and MSR1 of source-follower stage 80, respectively. Source-follower stage 80 is a differential source-follower amplifier with a cross-coupled pull-down current gain of approximately one.

Because the gate terminal of transistor MNR1 is coupled to the Vcc supply and the gate terminal of transistor MNR2 is coupled to the Vss supply (e.g., ground), node Pre_A is at a relatively low voltage, and node Pre_B is at a relatively high voltage. Therefore, the voltage at source terminal of transistor MSR2, i.e., node A, is one Vgs voltage lower than the voltage at node Pre_A, and the voltage at source terminal of transistor MSR1, i.e., node B, is one Vgs voltage lower than the voltage at node Pre_B. Current source 210 ensures that the DC loading current at node B meets the high-level specification defined by the LvPECL standard, and currents source 220 ensures that the DC loading current at node A meets the low-level specification defined by the LvPECL standard.

Transistors MPR1, and MPR2 of preamplifier 150 are active load transistors which are biased in the linear region. Transistor MPR1 is the active load for transistor MNR1, and transistor MPR2 is the active load for transistor MNR2. Resistor RP1 of preamplifier 50 is connected in parallel with and linearizes active load transistor MPR1. Similarly, resistor RP2 of preamplifier 50 is connected in parallel with and linearizes active load transistor MPR2. Transistors MPR3 of preamplifier 150 clamps the gate voltage of transistor MSR2 of source-follower stage 180 such that voltage at node A does not exceed the voltage level defined by the LvPECL standard. Similarly, transistors MPR4 of preamplifier 50 clamps the gate voltage of transistor MS1 of source-follower stage 80 such that the voltage at node B does not exceed the voltage level defined by the LvPECL standard.

Cross-coupled transistors MNCR1, and MNCR2 are adapted to aid the pull-down current. For example, when the voltage at node A increases, transistor MNCR1 conducts more current. This causes the voltage at node B to be pulled to a lower value, thus causing transistor MNC2 to become less conductive, and thereby raising the voltage at node A. Similarly, when the voltage at node A decreases, transistor MNCR1 conducts less current. This causes the voltage at node B to be pulled to a higher value, thus causing transistor MNCR2 to become more conductive, and thereby lowering the voltage at node A.

Feedback control block 300 is adapted to receive the voltages at nodes A and B and generate control voltages VOL_fix, and VOH_fix. The non-inverting input terminal of op-amp 310 is coupled to node C, and the inverting input terminal of op amp 310 is coupled to node B. The non-inverting input terminal of op-amp 350 is coupled to node A, and the inverting input terminal of op amp 350 is coupled to node D. Node C is disposed between resistor 315 and current source 320. Node D is disposed between resistor 355 and current source 360. RC network 325 is disposed between the output terminal of op-amp 310 and node B. RC network 370 is disposed between the output terminal of op-amp 350 and node D. RC Network 325 is a compensation circuitry that stabilizes the control loop of op-amp 310. RC Network 370 is also a compensation circuitry that stabilizes the control loop of op-amp 350.

Resistor 315 and currents source 320 have opposing temperature, therefore, the voltage at node C remains relatively constant with respect to temperature and process variations. Similarly, resistor 355 and current source 360 have opposing temperature coefficients, therefore, the voltage at node D remains relatively constant with respect to temperature and process variations. Op-amp 310 forces the voltages at nodes B and C to be substantially the same. Similarly, Op-amp 350 forces the voltages at nodes D and A to be substantially the same. Therefore, nodes A and B also remain relatively constant with respect to temperature and process variations. Op-amps 310 and 350 respectively generate control voltages VOH_fix, and VOL_fix that are applied to output block 100.

The above embodiments of the present disclosure are illustrative and not limitative. Other additions, subtractions, deletions, and modifications may be made without departing from the scope of the present invention as set forth in the appended claims

What is claimed is:

1. An output driver circuit comprising:
   an output block comprising:
      a differential preamplifier adapted to receive a differential input voltage signal and a differential control voltage signal and to generate a first differential voltage signal; and
      a source-follower stage adapted to receive the first differential voltage signal and generate a differential output voltage;
   a replication block comprising:
      a differential preamplifier adapted to receive first and second supply voltages and generate a second differential voltage signal; and
      a source-follower stage adapted to receive the second differential voltage signal and generate a third differential voltage signal; and
   a control block adapted to receive the third differential voltage signal and generate the differential control voltage applied to the output block, wherein said differential preamplifier of the output block comprises;
      first and second transistors adapted to receive the differential input voltage signal; and
      third and fourth transistors adapted to receive a first one of the differential control voltage, wherein the third transistor is an active load transistor coupled in series with the first transistor and the fourth transistor is an active load transistor coupled in series with the second transistor.

2. The output driver circuit of claim 1 wherein said differential preamplifier of the output block further comprises:
   fifth and sixth transistors adapted to receive a second one of the differential control voltage, wherein the fifth transistor has a first terminal that is coupled to the second supply voltage, and a second terminal coupled to a first node and to a terminal of the third transistor, wherein the sixth transistor has a first terminal that is coupled to the second supply voltage, and a second terminal coupled to a second node and to a terminal of the fourth transistor, wherein the first and second nodes carry the first differential voltage signal.

3. The output driver circuit of claim 2 wherein said differential preamplifier of the output block further comprises:
   a first resistor coupled in series with the third transistor; and
   a second resistor coupled in series with the fourth transistor.

4. The output driver circuit of claim 3 wherein said source-follower stage of the output block further comprises:
   a seventh transistor adapted to receive a first one of the first differential voltage signal and generate a first one of the differential output voltage;
   an eight transistor adapted to receive a second one of the first differential voltage signal and generate a second one of the differential output voltage; and
   ninth and tenth cross-coupled transistors disposed between the seventh and eight transistors and a first current supply.

5. The output driver circuit of claim 4 wherein said differential preamplifier of the replication block further comprises:
   first and second transistors adapted to receive the first and second supply voltages; and
   third and fourth transistors adapted to receive the first one of the differential control voltages, wherein the third transistor of the replication block is an active load transistor coupled in series with the first transistor of the replication block and the fourth transistor of the replication block is an active load transistor coupled in series with the second transistor of the replication block.

6. The output driver circuit of claim 5 wherein said differential preamplifier of the replication block further comprises:
   fifth and sixth transistors adapted to receive the second one of the differential control voltages, wherein the fifth transistor of the replication block has a first terminal that is coupled to the second supply voltage, and a second terminal coupled to a third node and to a terminal of the third transistor of the replication block, wherein the sixth transistor of the replication block has a first terminal that is coupled to the second supply voltage, and a second terminal coupled to a fourth node and to a terminal of the fourth transistor of the replication block, wherein the third and fourth nodes carry the second differential voltage.

7. The output driver circuit of claim 6 wherein said differential preamplifier of the replication block further comprises:
   a first resistor coupled in series with the third transistor of the replication block; and
   a second resistor coupled in series with the fourth transistor of the replication block.

8. The output driver circuit of claim 7 wherein said source-follower stage of the replication block further comprises:
   a seventh transistor adapted to receive a first one of the second differential voltage signal;
   an eight transistor adapted to receive a second one of the second differential voltage signal; and
   ninth and tenth cross-coupled transistors disposed between the seventh and eight transistors of the replication block and a second current supply.

9. The output driver circuit of claim 1 wherein said control block comprises:

a first op-amp adapted to receive a first one of the third differential voltage and generate a first one of the differential control voltage; and a second op-amp adapted to receive a second one of the third differential voltage and generate a second one of the differential control voltage.

10. The output driver circuit of claim 9 wherein said control block further comprises:

a first resistor having a first terminal coupled to the first supply voltage and a second terminal coupled to a third current source, wherein the second terminal of the first resistor of the control block is coupled to an input terminal of the first op-amp; and a second resistor having a first terminal coupled to the first supply voltage and a second terminal coupled to a fourth current source, wherein the second terminal of the second resistor of the control block is coupled to an input terminal of the second op-amp.

11. The output driver circuit of claim 9 wherein said control block further comprises:

a first RC network coupled to an output terminal of the first op-amp; and a second RC network coupled to an output terminal of the second op-amp.

* * * * *